US008624322B1

(12) United States Patent
Su et al.

(10) Patent No.: US 8,624,322 B1
(45) Date of Patent: Jan. 7, 2014

(54) HIGH VOLTAGE DEVICE WITH A PARALLEL RESISTOR

(75) Inventors: Ru-Yi Su, Kouhu Township, Yunlin County (TW); Fu-Chih Yang, Fengshan (TW); Chun Lin Tsai, Hsin-Chu (TW); Ker Hsiao Huo, Taichung (TW); Jen-Hao Yeh, Kaohsiung (TW); Chun-Wei Hsu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/551,262

(22) Filed: Jul. 17, 2012

(51) Int. Cl.
*H01L 23/62* (2006.01)
*H01L 21/8234* (2006.01)

(52) U.S. Cl.
USPC .................... 257/359; 257/E27.016; 428/238

(58) Field of Classification Search
CPC . H01L 23/5228; H01L 27/11; H01L 27/1214; H01L 27/0251; H01L 27/10852; H01L 27/1112
USPC .......... 257/380, 379, 358, 359, 360, E27.016; 438/142, 210, 238
See application file for complete search history.

(56) References Cited

U.S. PATENT DOCUMENTS

| 5,498,899 | A | 3/1996 | Palara |
| 6,680,515 | B1 | 1/2004 | Hsing |
| 2012/0119265 | A1 | 5/2012 | Su et al. |
| 2012/0132995 | A1* | 5/2012 | Cheng et al. .................. 257/363 |
| 2012/0139041 | A1 | 6/2012 | Su et al. |

OTHER PUBLICATIONS

Udrea, F., "State-of-the-art Technologies and Devices for High-Voltage Integrated Circuits," The Institution of Engineering and Technology 2007, doi:10.1049/iet-cds:20070025, p. 357-365.
U.S. Patent Office, unpublished U.S. Appl. No. 13/100,714, filed May 4, 2011 titled "High Voltage Resistor with Biased-Well," 17 pages.
U.S. Patent Office, unpublished U.S. Appl. No. 13/195,156, filed Aug. 1, 2011 titled "High Voltage Resistor with High Voltage Junction Termination," 22 pages.
U.S. Patent Office, unpublished U.S. Appl. No. 13/160,030, filed Jun. 14, 2011 titled "High Voltage Resistor with Pin Diode Isolation," 23 pages.

* cited by examiner

*Primary Examiner* — Nikolay Yushin
(74) *Attorney, Agent, or Firm* — Haynes and Boone, LLP (57) ABSTRACT

Provided is a high voltage semiconductor device. The high voltage semiconductor device includes a transistor having a gate, a source, and a drain. The source and the drain are formed in a doped substrate and are separated by a drift region of the substrate. The gate is formed over the drift region and between the source and the drain. The transistor is configured to handle high voltage conditions that are at least a few hundred volts. The high voltage semiconductor device includes a dielectric structure formed between the source and the drain of the transistor. The dielectric structure protrudes into and out of the substrate. Different parts of the dielectric structure have uneven thicknesses. The high voltage semiconductor device includes a resistor formed over the dielectric structure. The resistor has a plurality of winding segments that are substantially evenly spaced apart.

20 Claims, 13 Drawing Sheets

Square-type Layout

HIGH VOLTAGE DEVICE WITH A PARALLEL RESISTOR

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

These ICs include high voltage semiconductor devices. As geometry size continues to be scaled down, it has become increasingly more difficult for existing high voltage semiconductor devices to achieve certain performance criteria. As an example, a breakdown voltage may become a performance limitation for traditional high voltage semiconductor devices. In conventional high voltage semiconductor devices, improvement in the breakdown voltage by reducing drift region doping may lead to an undesirable increase in an on-state resistance of the device.

Therefore, while existing high voltage semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
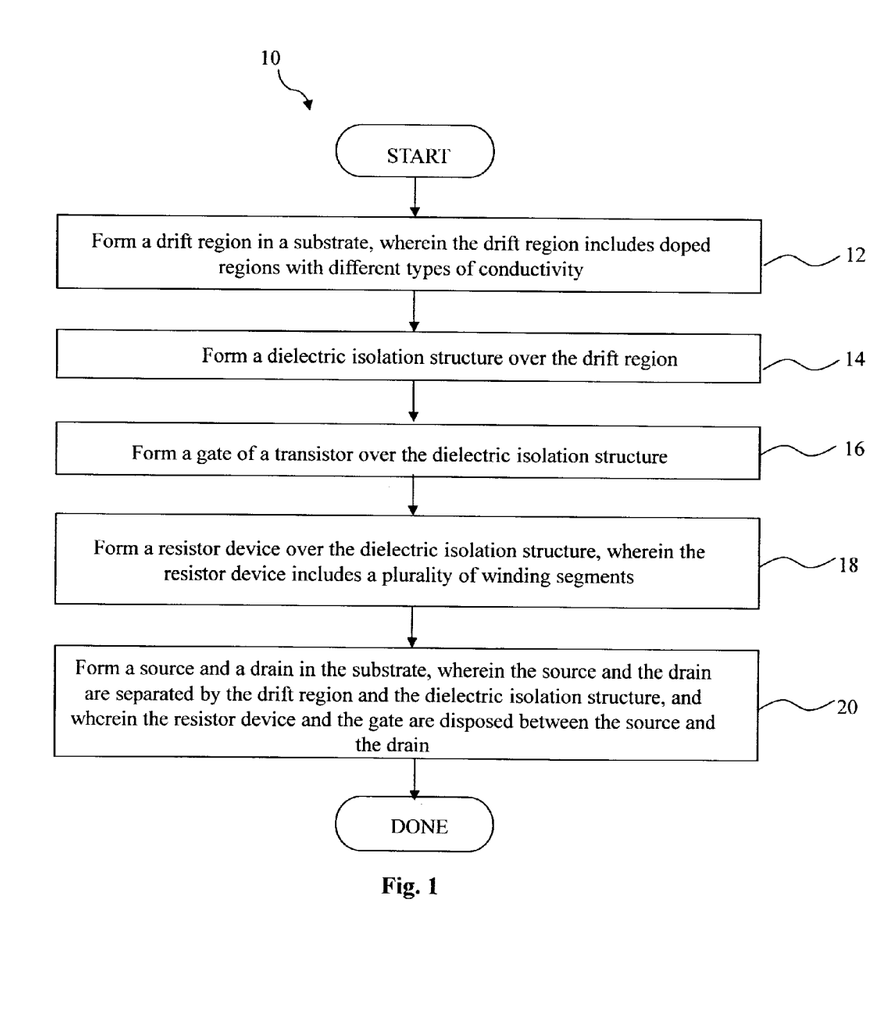
FIG. 1 is a flowchart illustrating a method for fabricating a high voltage semiconductor device according to various aspects of the present disclosure.

Illustrated in FIG. 1 is a flowchart of a method 10 of fabricating a high voltage semiconductor device according to various aspects of the present disclosure. The method 10 includes a block 12 in which a drift region is formed in a substrate. The drift region includes doped regions with different types of conductivity. The method 10 includes a block 14 in which a dielectric isolation structure is formed over the drift region. In some embodiments, the dielectric isolation structure includes a local oxidation of silicon (LOCOS) that protrudes out of a surface of the substrate. The method 10 includes a block 16 in which a gate of a transistor is formed over a portion of the dielectric isolation structure. The method 10 includes a block 18 in which a resistor device is formed over the dielectric isolation structure. The resistor device includes a plurality of winding segments. In some embodiments, the winding segments have substantially uniform dimensions and spacing. The method 10 includes a block 20 in which a source and a drain in the substrate. The source and the drain are separated by the drift region and the dielectric isolation structure. The resistor device and the gate are disposed between the source and the drain.

It is understood that additional steps may be performed to complete the fabrication of the high voltage semiconductor device. For example, the method may include a step in which an interconnect structure is formed over the substrate. The interconnect structure either electrically couples the resistor device in parallel to the transistor, or leaves the resistor electrically floating.

Figure 2:
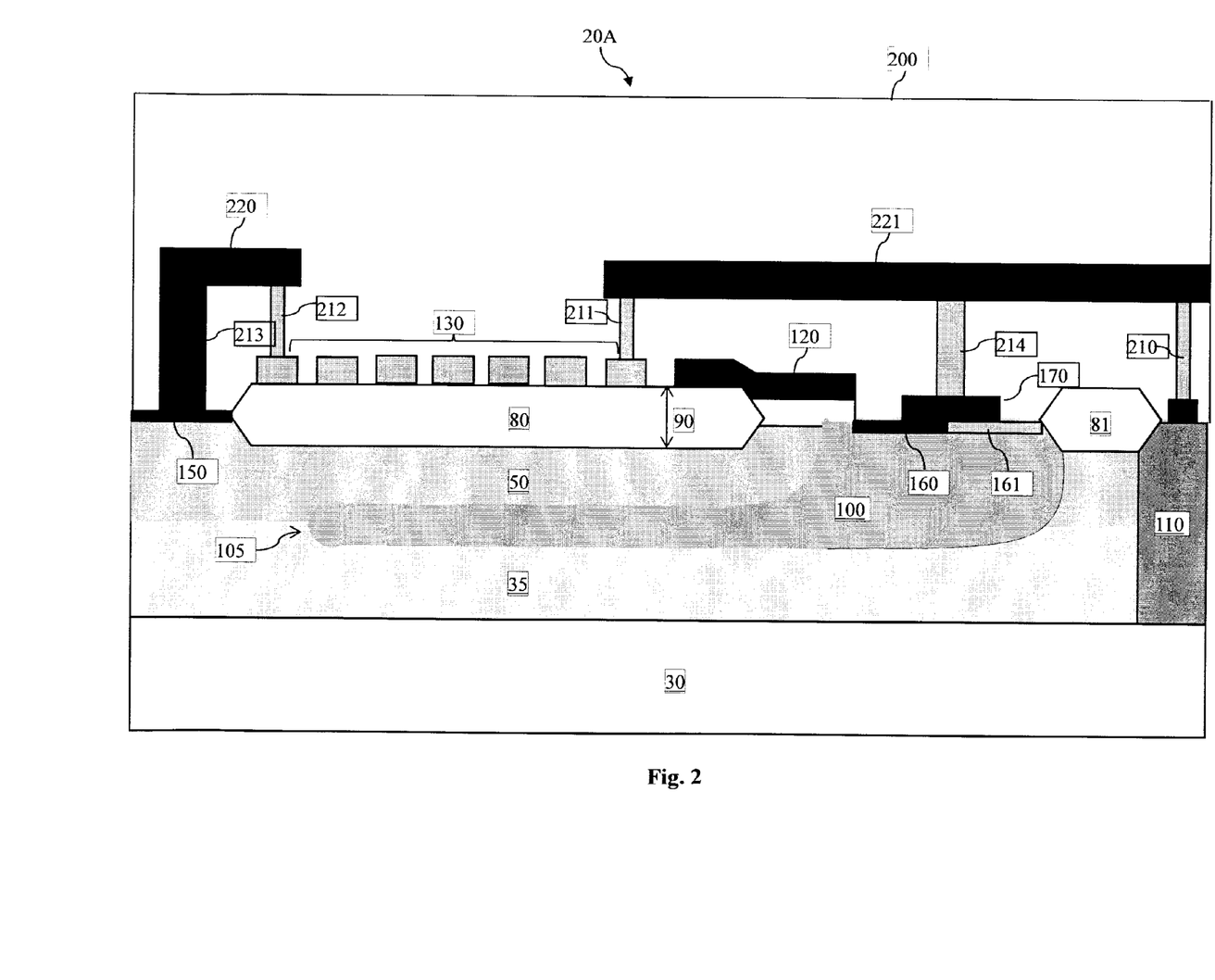
FIGS. 2-9 are diagrammatic fragmentary cross-sectional side views of various embodiments of a high voltage semiconductor device in accordance with various aspects of the present disclosure.

FIG. 2 illustrates a diagrammatic fragmentary cross-sectional side view of a high voltage semiconductor device 20A according to an embodiment of the present disclosure. It is understood that FIG. 2 has been simplified for a better understanding of the inventive concepts of the present disclosure.

Referring to FIG. 2, the high voltage semiconductor device 20A includes a portion of a substrate 30. The substrate 30 is doped with a P-type dopant such as boron. In another embodiment, the substrate 30 may be doped with an N-type dopant such as phosphorous or arsenic. The substrate 30 may also include other suitable elementary semiconductor materials, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

A buried well 35 is formed in a portion of the substrate 30 through an ion implantation process known in the art. The buried well 35 is formed to have an opposite type of conductivity than that of the substrate 30. In the illustrated embodiment, the buried well 35 is N-type doped, since the substrate 30 herein is a P-type substrate. In another embodiment where the substrate 30 is an N-type substrate, the buried well 35 is P-type doped. The buried well 35 may be formed by an implantation process having a dose that is in a range from about $1 \times 10^{12}$ atoms/centimeter$^2$ to about $2 \times 10^{12}$ atoms/centimeter$^2$. The buried well 35 may have a doping concentration that is in a range from about $1 \times 10^{15}$ atoms/centimeter$^3$ to about $1 \times 10^{16}$ atoms/centimeter$^3$.

A high voltage doped well 50 is formed in the substrate 30. The high voltage doped well 50 may be formed by an ion implantation process known in the art. For example, the doped well 50 may be formed by an implantation process having a dose that is in a range from about $3 \times 10^{12}$ atoms/centimeter$^2$ to about $4 \times 10^{12}$ atoms/centimeter$^2$. In an embodiment, the high voltage doped well has a doping concentration that is in a range from about $1 \times 10^{15}$ atoms/centimeter$^3$ to about $1 \times 10^{16}$ atoms/centimeter$^3$. A patterned photoresist layer (not illustrated) may be formed over the substrate 35 as a mask during the implantation process.

The high voltage doped well 50 is doped with the same type of conductivity as the buried well 35 (i.e., opposite from that of the substrate 30). Thus, the high voltage doped well 50 is a high voltage N-well (HVNW) in the illustrated embodiment. The high voltage doped well 50 may also be referred to as a drift region 50. In some embodiments, the buried well 35 may be considered to be a part of the high voltage doped well 50 and may be considered to be a part of the drift region 50 as well.

A plurality of isolation structures are formed over the drift region 50, for example isolation structures 80 and 81 shown in FIG. 2. The isolation structures 80-81 may include a dielectric material. In the embodiment shown in FIG. 2, the isolation structures 80-81 are Local Oxidation of Silicon (LOCOS) devices (also referred to as field oxide). The LOCOS devices may be formed using a nitride mask and thermal-growing an oxide material through the mask openings. At least a portion of the LOCOS devices protrude downwardly into, and protrude upwardly out of, the drift region 50. Furthermore, the LOCOS devices may have uneven thicknesses (or depths). For example, the edge portions of the LOCOS devices may have tapered shapes and thus smaller thicknesses. In some embodiments, the non-edge portions of the LOCOS devices have a thickness 90, which may be in a range from about 0.2 microns (um) to about 1 um in certain embodiments.

Alternatively, the isolation structures 80-81 may include shallow trench isolation (STI) devices or deep trench isolation (DTI) devices. The isolation structures 80-81 help define boundaries of certain doped regions to be formed later, for example boundaries of source and drain regions of a Field Effect Transistor (FET) device.

A doped extension region 100 is formed in the drift region 50. In the embodiment shown, the doped extension region 100 is formed between the high voltage doped well 50 and the buried well 35. The doped extension region 100 has the same type of conductivity as the substrate 30 but an opposite type of conductivity as the drift region 50. Thus, in the embodiment shown, the doped extension region 100 has a P-type of conductivity.

In certain embodiments, the doped extension region 100 may be formed by two separate ion implantation processes. The first ion implantation process forms a doped region at least partially in the upper portion of the drift region 50 (near the upper surface of the drift region 50). The second ion implantation process forms a deeper and wider doped region that "extends" or "protrudes" laterally outward. Subsequently, a thermal process may be performed to inter-diffuse and merge the two doped regions into a single doped region, thereby forming the doped extension region 100. As a result, the doped extension region 100 has a protruding portion 105 (or protruding tip) that laterally extends or protrudes partially into the drift region 50. Therefore, the doped extension region 100 may also be referred to as a P-body extension region 100 herein.

As is shown in FIG. 2, the protruding portion 105 is buried inside the drift region 50, rather than being located near the upper surface of the drift region 50. In other words, the protruding portion 105 is located away from the surface of the drift region 50. One benefit offered by the protruding portion 105 is that it can provide extra conduction path to reduce an on-state resistance of a transistor.

Using the same implantation processes that form the doped extension region 100, a doped isolation region 110 is also formed. In an embodiment, the doped isolation region 110 is formed using the second ion implantation process (the one that forms the wider and deeper doped region). To define the lateral size of the doped isolation region 110, a patterned photoresist mask layer may be formed that has an opening, and the above-mentioned second ion implantation process may be performed through the opening to define the doped isolation region 110. Stated differently, the doped isolation region 110 is also formed during the formation of the protruding portion 105 of the doped extension region 100. Thus, the doped isolation region 110 may have a dopant concentration level that is approximately the same as the dopant concentration level of the protruding portion 105.

A gate 120 is formed over the drift region 50. Specifically, the gate 120 may be formed on a portion of the isolation structure 80. The gate 120 may be formed by a plurality of deposition and patterning processes. In some embodiments, the gate 120 includes a polysilicon material having a silicided surface. The silicided surface may include tungsten silicide, for example.

A resistor device 130 is formed over the isolation structure 80. In some embodiments, the resistor device 130 includes a polysilicon material, and may therefore be referred to as a polysilicon resistor. For example, the resistor device 130 may include an undoped polysilicon material, a P-doped polysilicon material, or a silicide on polysilicon material. The resistor device 130 is designed to handle high voltages, for example voltages greater than about 100 volts, and may be as high as a few hundred volts. Thus, the resistor device 130 may also be referred to as a high voltage resistor device. In some embodiments, the resistor device 130 is formed at the same time as the gate 120. In other embodiments, the resistor device 130 and the gate 120 are formed at separate times using different processes.

According to the various aspects of the present disclosure, the resistor device 130 has an elongate and winding shape. In the cross-sectional view shown in FIG. 2, the resistor device 130 appears as a plurality of winding segments. It is understood, however, that these winding segments may actually be parts of an individual elongate resistor device 130. In some embodiments, the winding segments of the resistor device 130 have substantially uniform vertical and lateral dimensions (i.e., heights/thicknesses and widths). For example, each winding segment's vertical and lateral dimensions may vary within a few percentage points (or less than a percentage point) of those of another winding segment. In some embodiments, the spacing between adjacent winding segments of the resistor device 130 is also substantially uniform.

A heavily doped drain region 150 is formed at the upper surface of the drift region 50 on one side of the isolation structure 80, and a heavily doped source region 160 is formed at the upper surface of the doped extension region 100 on the opposite side of the isolation structure 80. In other words, the drain region 150 and the source region 160 are located on opposite sides of the isolation structure 80. A heavily doped region 161 is also formed adjacent to the source region 160. In some embodiments, the heavily doped region 161 may serve as a guard ring.

The drain region 150 and the source region 160 have the same type of conductivity as the drift region 50, and the heavily doped region 161 has the same type of conductivity as the doped extension region 100. Thus, in the embodiment shown in FIG. 2, the drain region 150 the source region 160 are N-type doped, and the heavily doped region 161 is P-type doped. The drain region 150 and the source region 160 have dopant concentration levels that are significantly higher than the dopant concentration level of the drift region 50. The heavily doped region 161 has a dopant concentration level that is significantly higher than the dopant concentration level of the doped extension region 100. Therefore, in the embodiment shown, the drain region 150 and the source region 160 may be referred to as N+ regions, and the heavily doped region 161 may be referred to as an P+ region. Conductive pads such as pads 170 may also be formed on the source or drain regions (or the doped isolation region 110) to help establish electrical connections to these source and drain regions.

The gate 120 (which is located between the drain region 150 and the source region 160), the drain region 150, and the source region 160 are components of a FET transistor device. The FET transistor device is a high voltage transistor configured to handle high voltages in the present disclosure. For example, the FET transistor device may be capable of operating under voltages as high as a few hundred volts.

An interconnect structure 200 is formed over the surface of the substrate 30. In other words, the interconnect structure 200 is formed over the isolation structures 80-81, the gate 120, the resistor device 130, and the source and drain regions 160 and 150, among other things. The interconnect structure 200 includes a plurality of patterned dielectric layers and conductive layers that provide interconnections (e.g., wiring) between circuitries, inputs/outputs, and various doped features (for example, the drift region 50). In more detail, the interconnect structure 200 may include a plurality of interconnect layers, also referred to as metal layers. Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 200 includes an interlayer dielectric (ILD) that provides isolation between the interconnect layers. The ILD may include a dielectric material such as a low-k material or an oxide material. The interconnect structure 200 also includes a plurality of contacts/contacts that provide electrical connections between the different interconnect layers and/or the features on the substrate, such as the source and drain regions 160 and 150 or the resistor device 130.

For example, as part of the interconnect structure 200, a plurality of contacts 210-214 is formed to provide electrical connections to the doped isolation region 110, the resistor device 130, the drain region 150, and the source region 160. In the embodiment shown in FIG. 2, the contacts 211-212 are formed on, and electrically coupled to, opposite distal ends of the resistor device 130.

The interconnect structure 200 also includes metal lines (or interconnect lines) that are electrically coupled to the contact pads 210-214. For example, a metal line 220 is electrically coupled to the contacts 212-213, and a metal line 221 is electrically coupled to the contacts 210-211 and 214. In other words, one end of the resistor device 130 is electrically coupled to the drain region 150, and the other end of the resistor device 130 is electrically coupled to the source region 160 and the doped isolation region 110. In this manner, the resistor device 130 is electrically coupled to the FET transistor device in parallel, specifically, to the drain and source/substrate of the FET transistor device in parallel.

According to the various aspects of the present disclosure, the parallel-coupled resistor device 130 improves the uniformity of the electric field in the drift region 50. As discussed above, the resistor device 130 has a plurality of substantially uniform winding segments, whose spacing there between is also substantially uniform. As such, each winding segment can bear a substantially fixed and uniform amount of electrical voltage. In other words, when a high electrical voltage (for example on the order of a few hundred volts) is applied to the FET transistor between its source and drain, that high electrical voltage is applied to the resistor device 130 as well, since it is electrically coupled in parallel to the FET transistor. The uniformity in the dimensions and spacing of the resistor device 130 segments allows the high electrical voltage to be spread evenly and uniformly across the span of the resistor device 130, thereby improving the uniformity of the electric field in the drift region 50 below the resistor device 130. As a result of the more uniformly distributed electric field, the breakdown voltage of the FET transistor is increased as well. It has been observed during testing that by implementing the parallel resistor device according to the present disclosure, the breakdown voltage can be increased by over a hundred volts.

FIGS. 3-9 illustrate diagrammatic fragmentary cross-sectional side views of a high voltage semiconductor device according to alternative embodiments of the present disclosure. For reasons of consistency and clarity, similar components are labeled the same throughout FIGS. 2-9.

Figure 3:
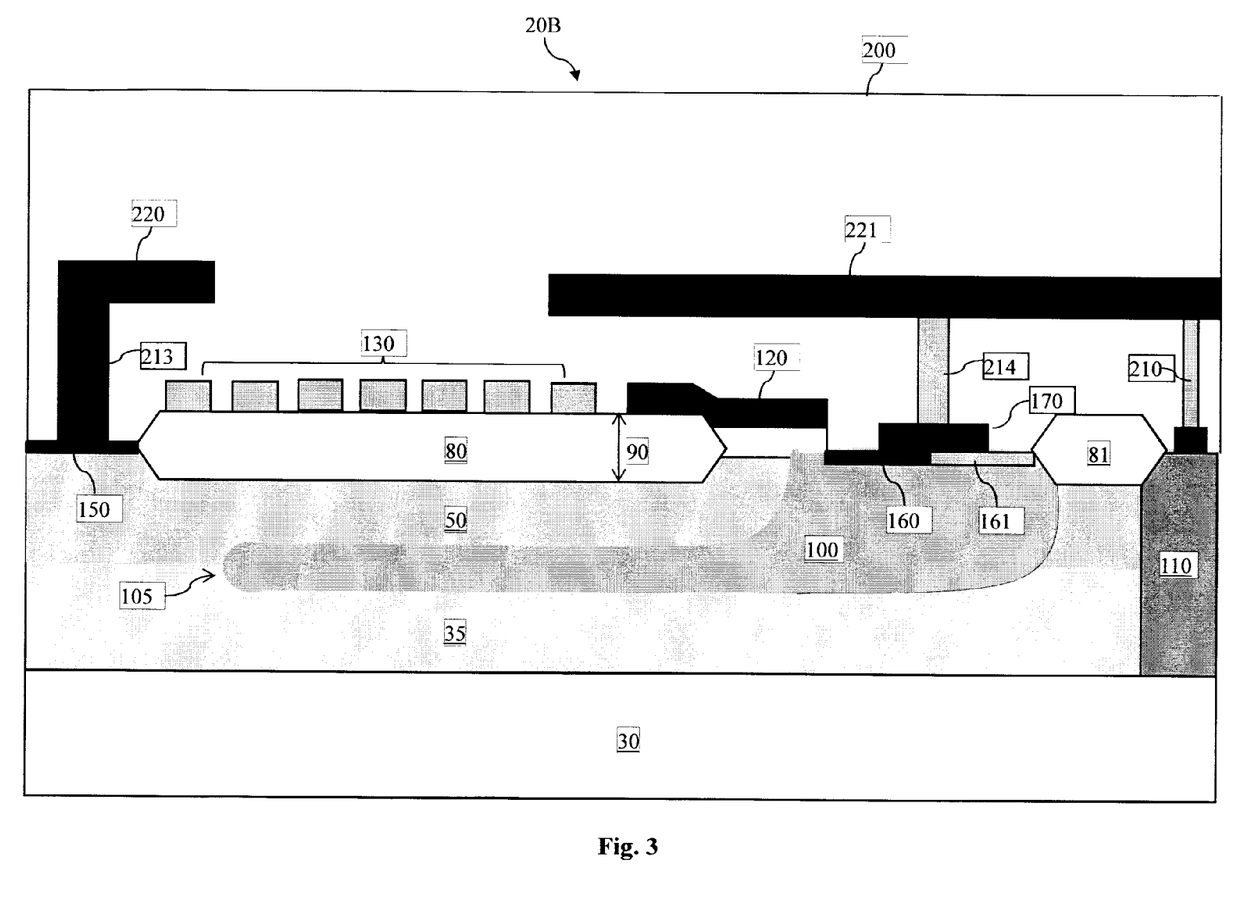

Referring to FIG. 3, a high voltage semiconductor device 20B is similar to the high voltage semiconductor device 20A in many regards. One difference between the high voltage semiconductor devices 20A and 20B is that, unlike the high voltage semiconductor device 20A, the high voltage semiconductor device 20B is electrically floating. For example, none of the segments of the resistor device 130 is directly electrically coupled to any components of the FET transistor device. Nevertheless, the resistor device 130 may be viewed as being electrically coupled in parallel to the FET transistor device through induction. In a sense, the drift region 50, the isolation structure 80, and the resistor device 130 form a capacitor. In particular, the isolation structure 80 serves as the insulator component of the capacitor (since the isolation structure 80 is dielectric), and the drift region 50 and the resistor device 130 each serve as the electrical conductors sandwiching the insulator component. This also helps improve the uniformity of the electric field within the high voltage semiconductor device 20B. Stated differently, even though the resistor device 130 is implemented as an electrically-floating resistor device, the high voltage semiconductor device 20B still offers an increased (and thus better) breakdown voltage over conventional high voltage semiconductor devices.

Figure 4:
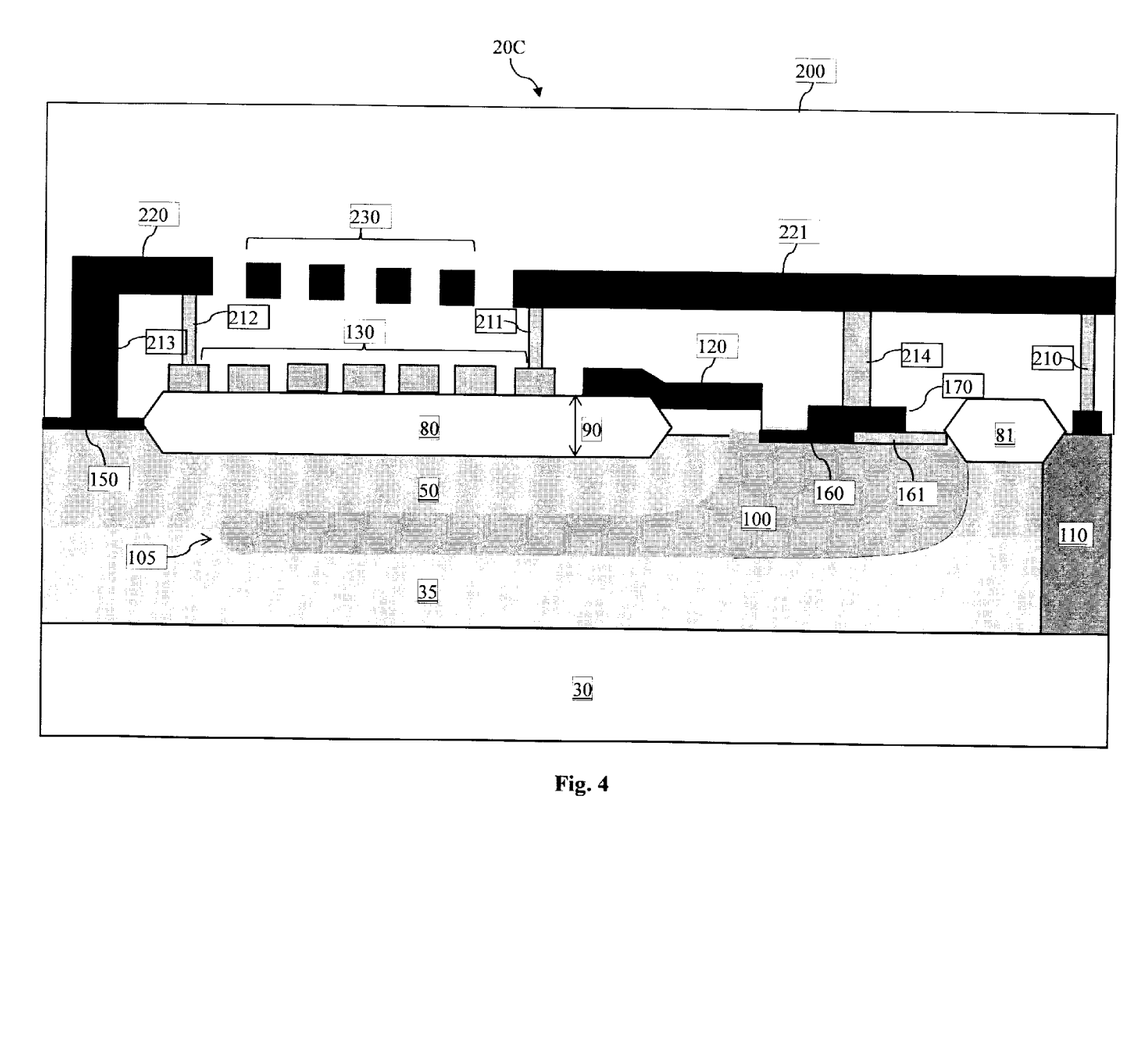

Referring to FIG. 4, a high voltage semiconductor device 20C is similar to the high voltage semiconductor device 20A in many regards. One difference between the high voltage semiconductor device 20A and 20C is that the high voltage semiconductor device 20C includes an electrically floating metal conductor 230. The electrically-floating metal conductor 230 is disposed over the resistor device 130, but it has no direct electrical connections to components of the FET transistor. For reasons similar to those discussed above associated with the resistor device 130, the implementation of the electrically-floating metal conductor 230 also helps improve the uniformity of the electrical field within the high voltage semiconductor device. Thus, the high voltage semiconductor device 20C also offers improved (i.e., a greater) breakdown voltage over conventional high voltage semiconductor devices.

Figure 5:
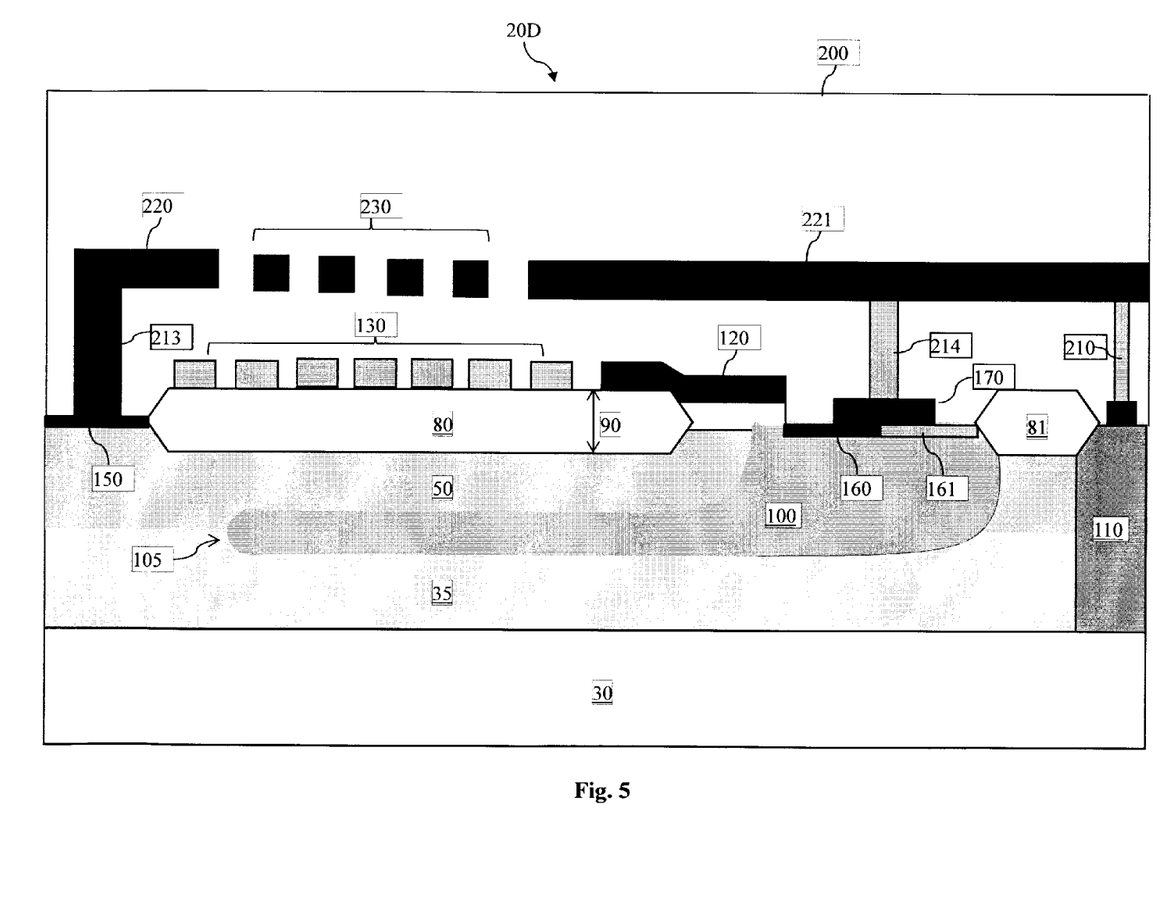

Referring to FIG. 5, a high voltage semiconductor device 20D combines aspects of both the high voltage semiconductor device 20B and 20C. In other words, the high voltage semiconductor device 20D has both an electrically-floating resistor device 130 as well as an electrically-floating metal conductor 230. Therefore, for reasons similar to those discussed above, the high voltage semiconductor device 20C has improved electrical field uniformity and therefore also offers improved breakdown voltage over conventional high voltage semiconductor devices.

Figure 6:
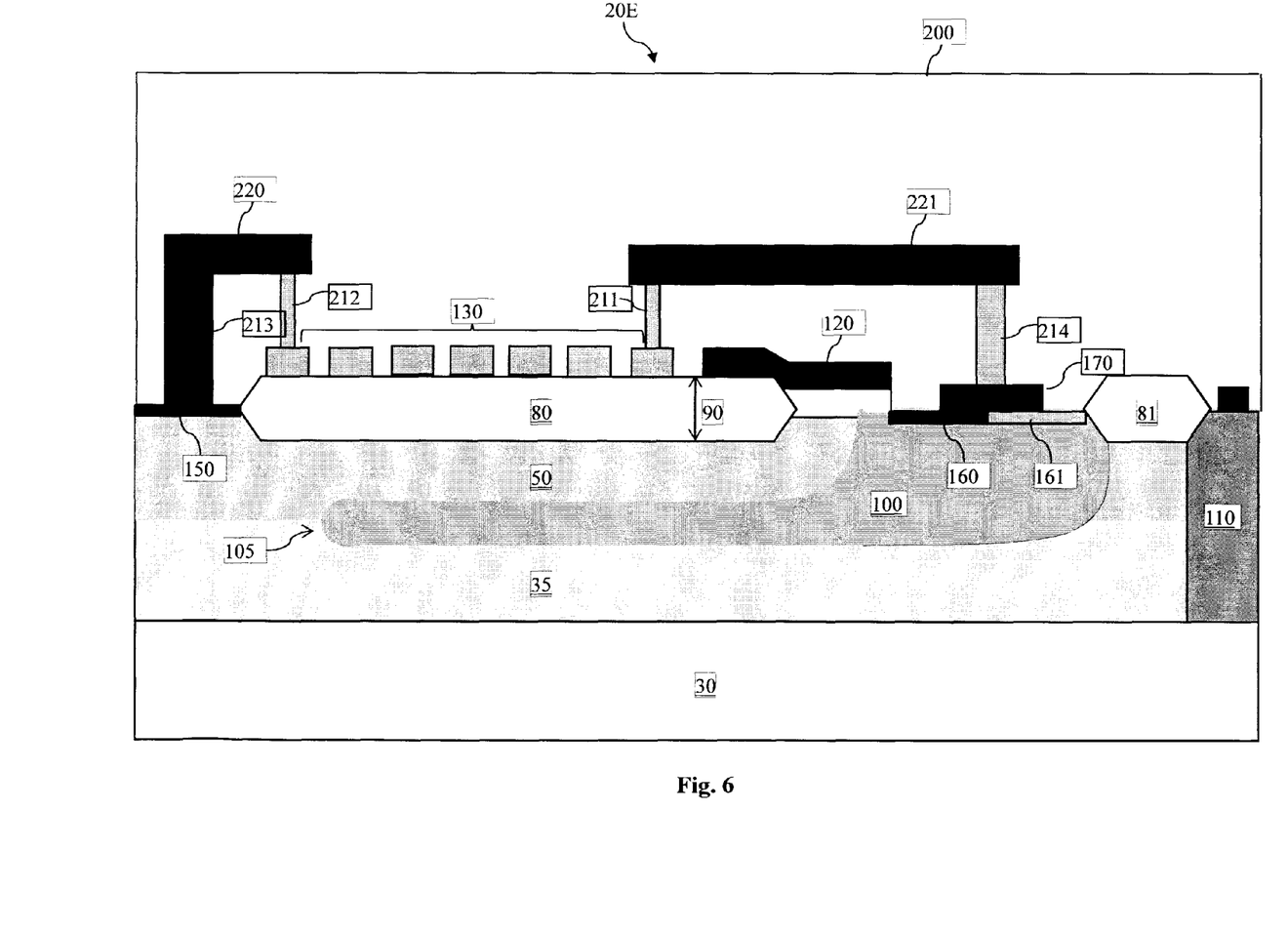
Figure 7:
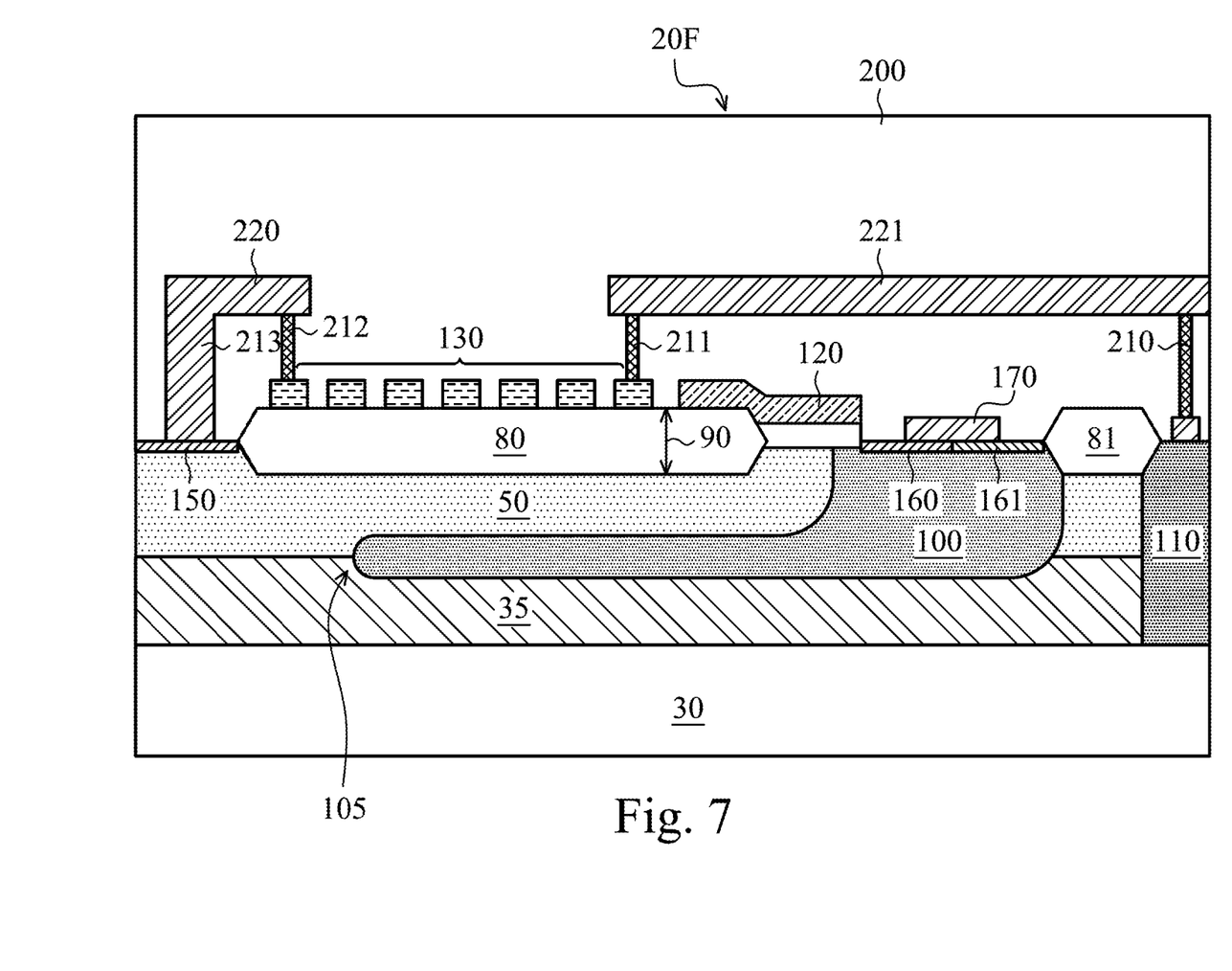

Referring to FIG. 6, a high voltage semiconductor device 20E is similar to the high voltage semiconductor device 20A in many regards. One difference between the high voltage semiconductor device 20A and 20E is that the resistor device 130 of the high voltage semiconductor device 20E is electrically coupled to the source region 160 of the FET transistor device, but not to the substrate (for example through the isolation region 110) itself. Similarly, a high voltage semiconductor device 20F illustrated in FIG. 7 has its resistor device 130 electrically coupled to the substrate 30 (through the doped isolation region 110), but not to the source region 160. Regardless of the specific electrical biasing configuration for the resistor device 130, the end effect is that the resistor device 130 is still electrically coupled to the FET transistor device in parallel, and therefore the uniformity of the electric field within the high voltage semiconductor device 20 can be improved for reasons similar to those discussed above. As such, both the high voltage semiconductor devices 20E and 20F offer enhanced breakdown voltages over conventional high voltage semiconductor devices as well.

Figure 8:
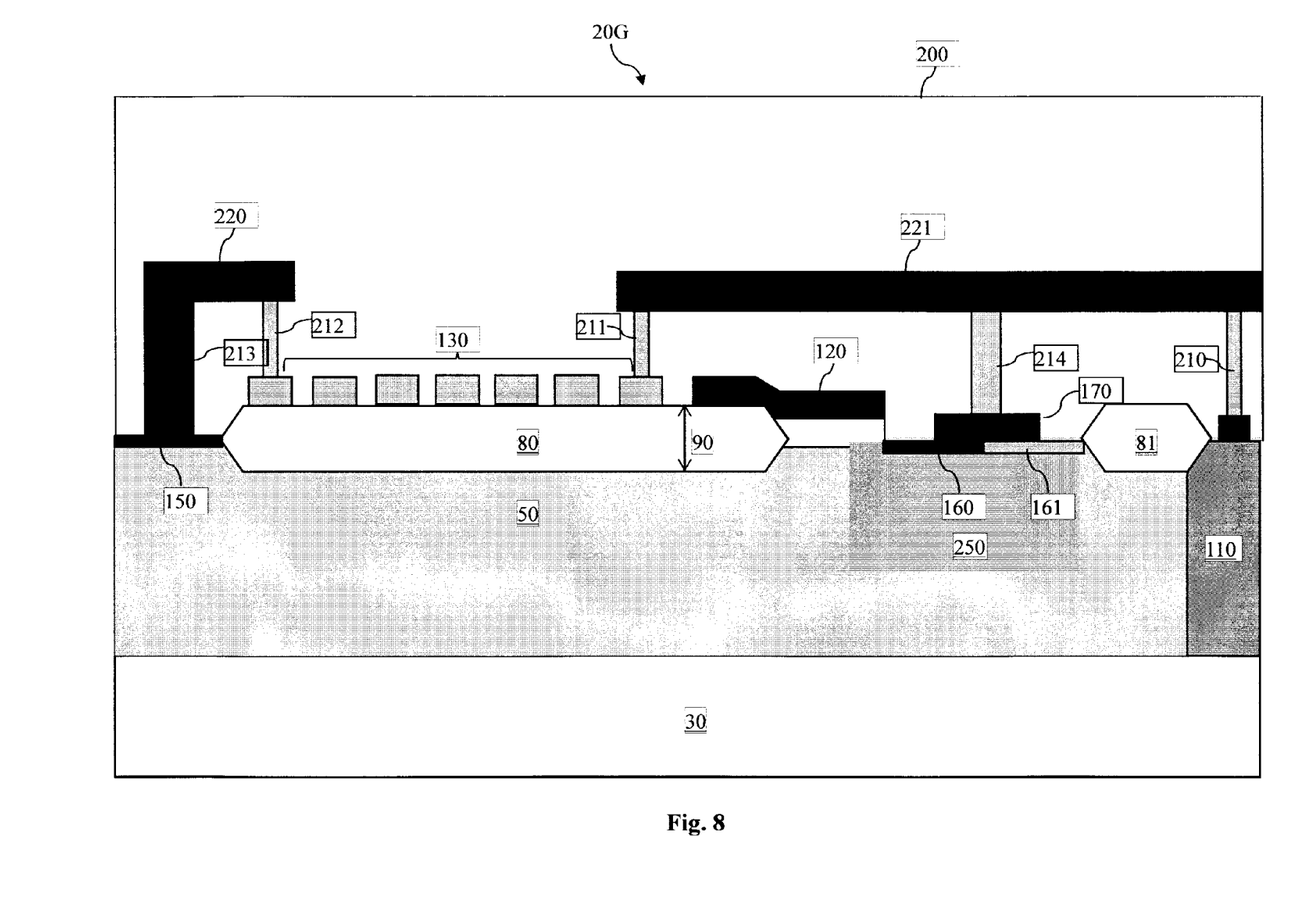

Referring now to FIG. 8, a high voltage semiconductor device 20G is similar to the high voltage semiconductor device 20A in many regards. One difference between the high voltage semiconductor device 20A and 20G is that the high voltage semiconductor device 20G includes a drift region 50 having one type of conductivity. In the embodiment illustrated, the high voltage semiconductor device 20G has an N-type drift region. In comparison, the drift region 50 of the high voltage semiconductor device 20A includes both N-type doped portions (for example the buried N-well 35 and the HVNW 50) and a P-type doped portion (for example the P-body extension 100). The source region 160 of the FET transistor device is formed within (or is surrounded by) a doped well 250, which in the embodiment illustrated in a P-well. Once again, regardless of the doping configurations of the drift region 50, the high voltage semiconductor device 20G still offers improved electric field uniformity due to the disposition of the parallel resistor device 130, and therefore has a greater breakdown voltage compared to conventional high voltage semiconductor devices.

Figure 9:
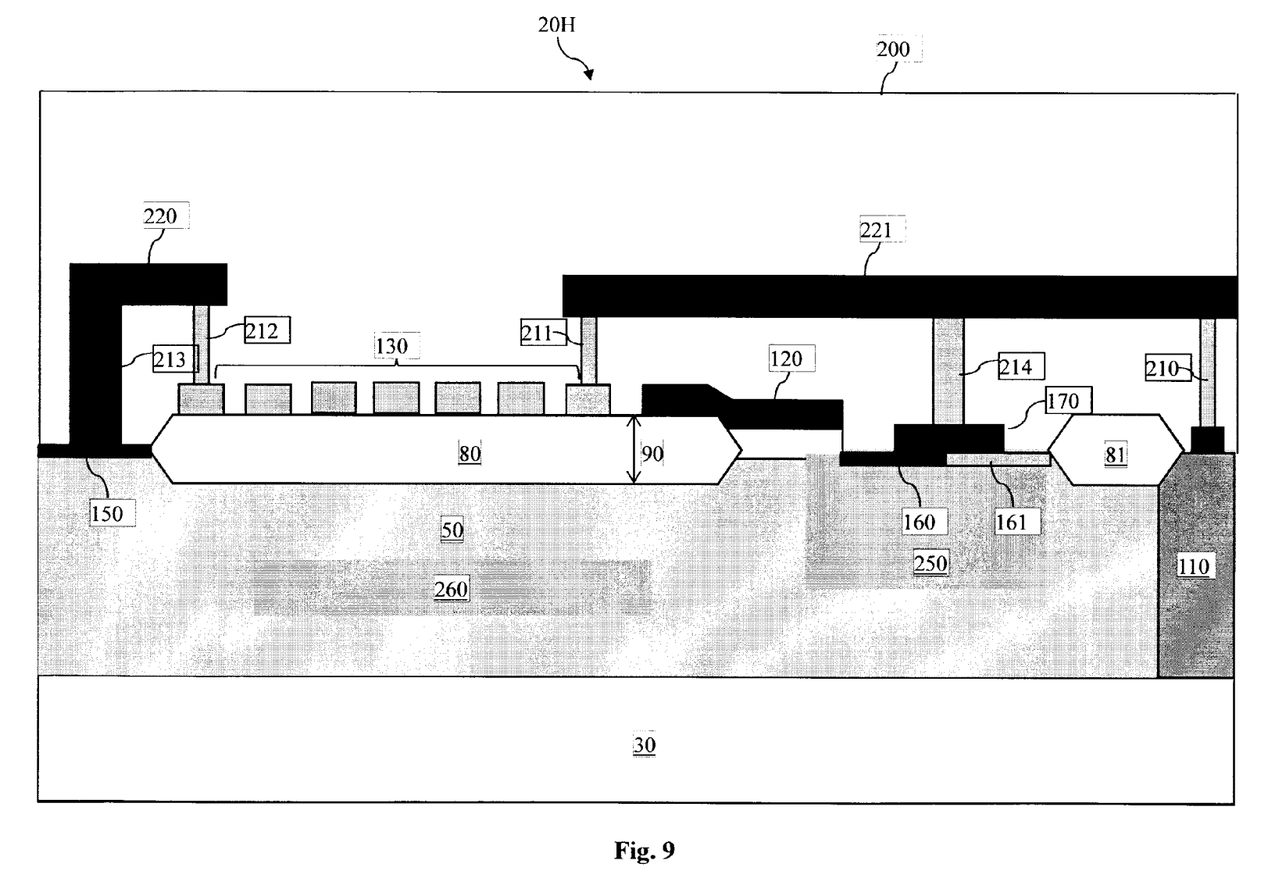

Referring now to FIG. 9, a high voltage semiconductor device 20H is similar to the high voltage semiconductor device 20G of FIG. 8 in many regards. One difference is that the high voltage semiconductor device 20H further includes a doped buried layer 260 in the drift region 50. The doped buried layer 260 has the opposite type of conductivity than that of the drift region 50. Therefore, the doped buried layer 260 is a P-buried layer in the embodiment shown in FIG. 9. Functionally, the doped buried layer 260 is similar to the P-body extension 100 discussed above. In any case, the high voltage semiconductor device 20H also offers improved electric field uniformity due to the disposition of the parallel resistor device 130, and therefore has a greater breakdown voltage compared to conventional high voltage semiconductor devices.

It is understood that the aspects of each of the embodiments of the high voltage semiconductor device 20A-20H may be combined with one another depending on design needs and manufacturing requirements. For example, it is understood that an embodiment of the high voltage semiconductor device may have an electrically-floating resistor device (such as in the embodiment shown in FIG. 3) and a drift region having a single type of conductivity (such as in the embodiment shown in FIG. 8). For reasons of simplicity, each possible combination of the above embodiments is not specifically discussed herein.

Figure 10B:
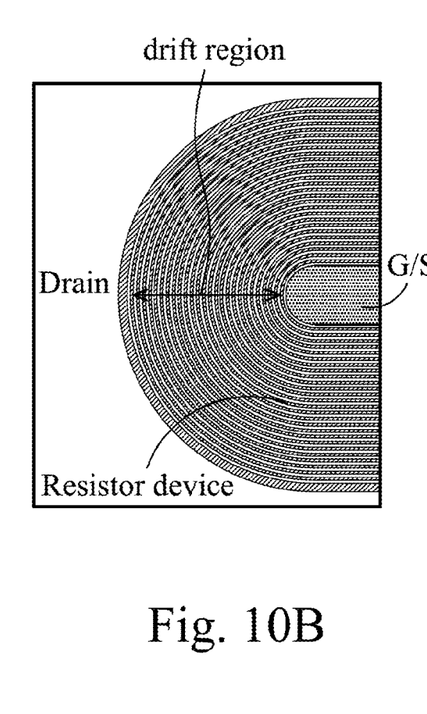
FIGS. 10-13 are simplified top views of various embodiments of a high voltage semiconductor device in accordance with various aspects of the present disclosure.
Figure 10C:
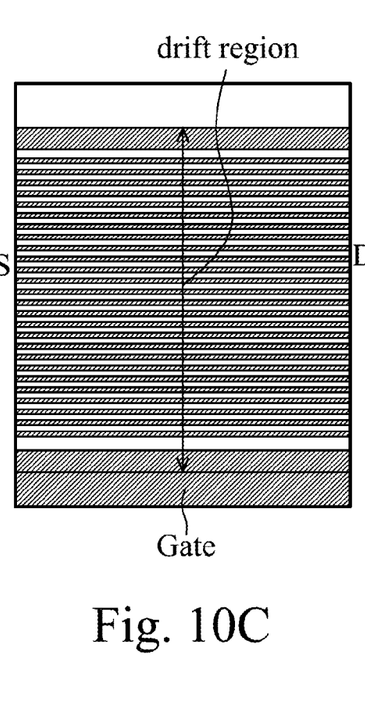
Figure 10D:
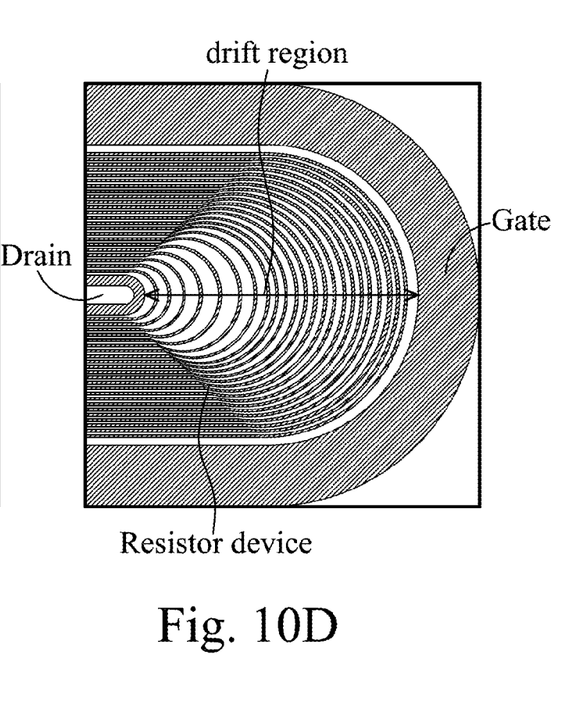

FIGS. 10A-10D are simplified fragmentary top views of an embodiment of the high voltage semiconductor device discussed above. In more detail, FIGS. 10B, 10C, and 10D are "zoomed-in" versions of various portions of FIG. 10A in order to show the high voltage semiconductor device with more clarity and detail. Some of the elements discussed above, such as the drift region, the gate, source, and drain of the FET transistor, and the resistor device electrically coupled in parallel to the FET transistor are labeled in example places in FIGS. 10A-10D to help the reader reconcile these top view Figures with the cross-sectional Figures discussed above.

Also as shown in FIGS. 10B-10D, the resistor device (electrically coupled in parallel to the FET transistor) includes a plurality of winding segments, which in the embodiment shown in FIGS. 10A-10D resemble running tracks in a stadium. As discussed above, in order to facilitate the uniform distribution of the electric field, these winding segments of the resistor device have substantially uniform dimensions and spacings there between.

Figure 11:
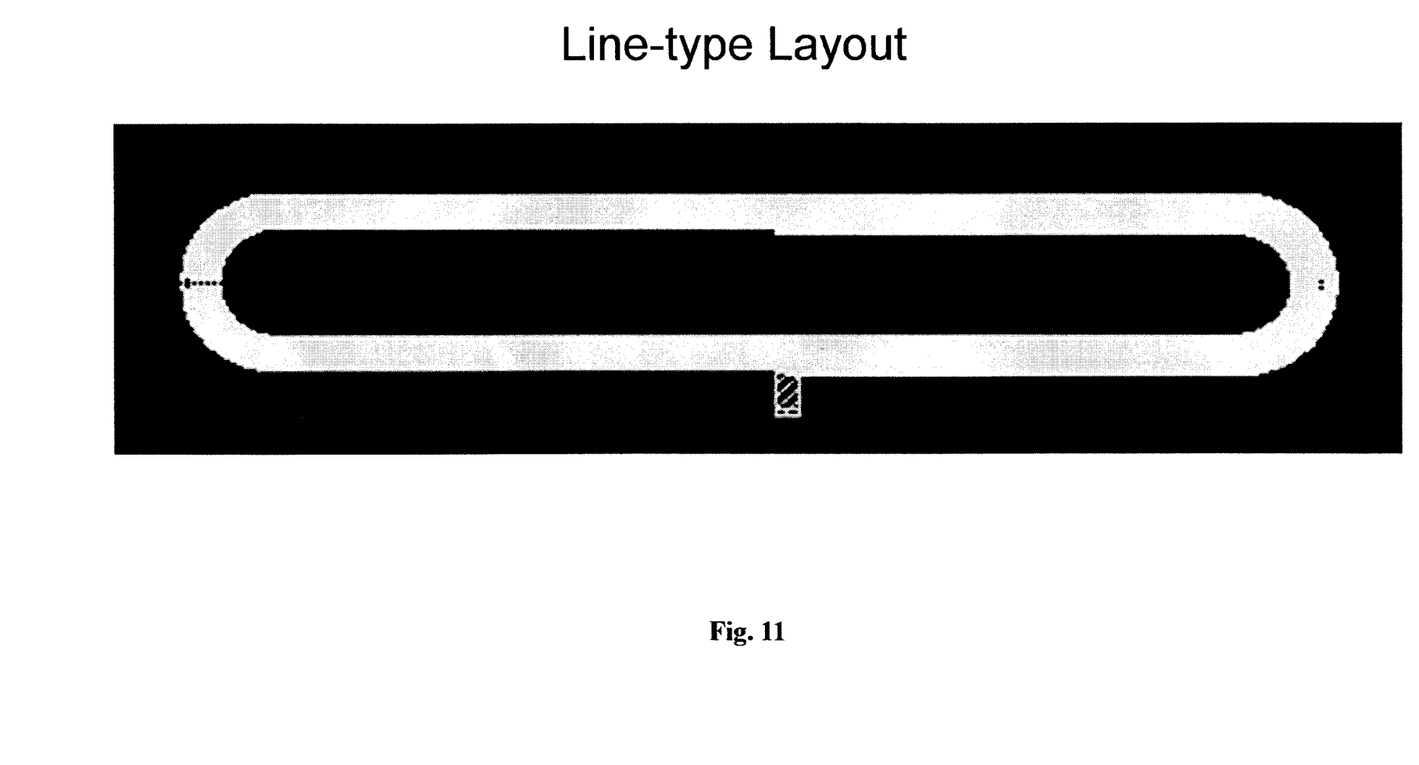
Figure 12:
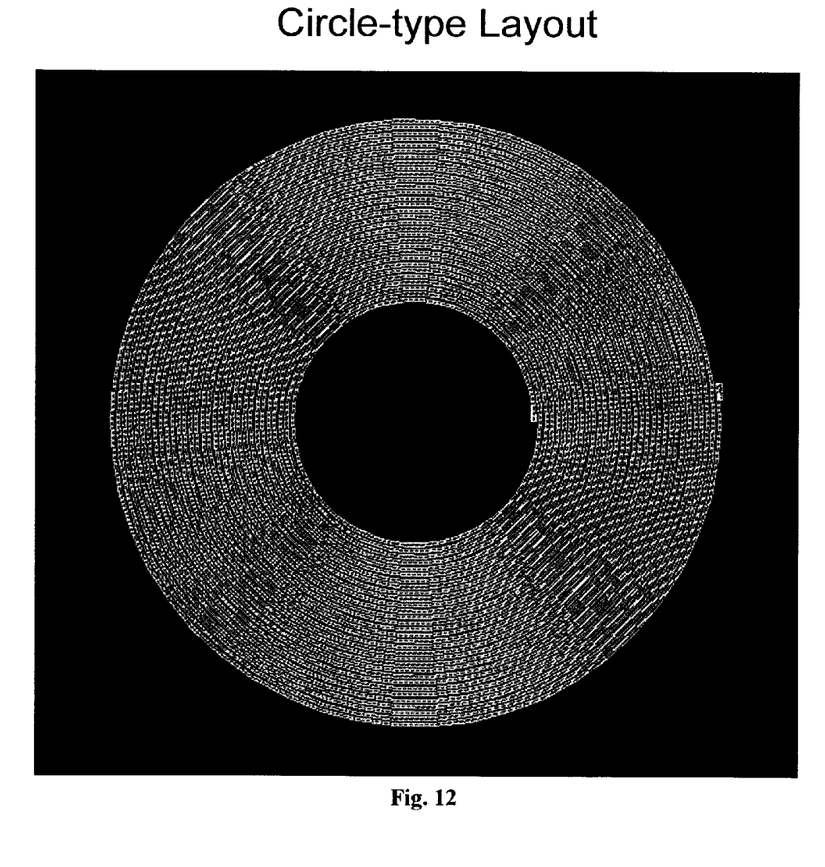
Figure 13:
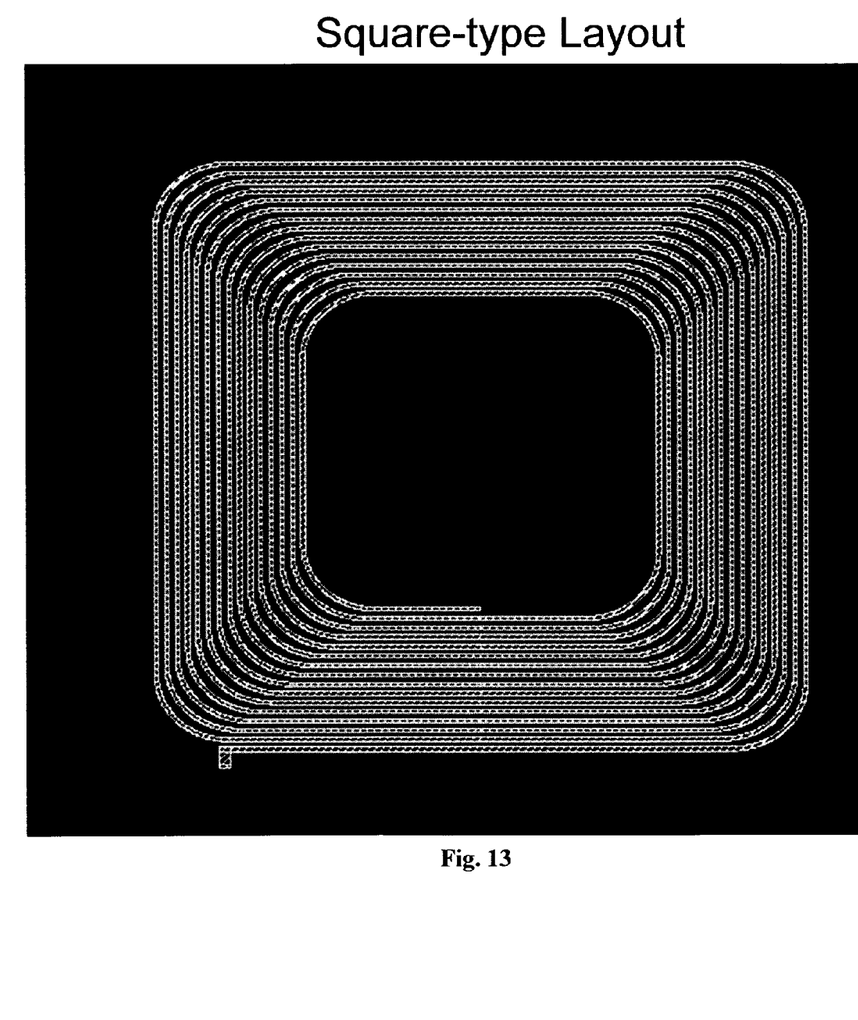

The layout of the high voltage semiconductor device shown in the top view of FIG. 10A is referred to as a "finger-type" layout. However, the high voltage semiconductor device of the present disclosure is not limited to such layout. Other suitable layouts may be used in various alternative embodiments. For example, FIG. 11 illustrates a "line-type" layout, FIG. 12 illustrates a "circle-type" layout, and FIG. 13 illustrates a "square-type" layout for a high voltage semiconductor device according to the present disclosure.

Additional processing steps may be performed to complete the fabrication of the high voltage semiconductor device. For example, after the interconnect structure is formed, a passivation process may be performed to the high voltage semiconductor device. As another example, the high voltage semiconductor device may also include one or more testing processes such as wafer acceptance testing processes. For reasons of simplicity, these additional fabrication processes are not discussed in detail herein.

One of the broader forms of the present disclosure involves a semiconductor device that includes: a substrate; a source and a drain disposed in the substrate; a drift region disposed in the substrate and between the source and the drain, wherein the drift region includes a plurality of doped portions having different types of conductivity; a dielectric component disposed on a surface of the substrate and between the source and the drain; a resistor disposed over the dielectric component; and a gate disposed over the dielectric component and between the resistor and one of: the source and the drain.

In some embodiments, the resistor is electrically floating.

In some embodiments, the source, the drain, and the gate are components of a transistor, and wherein the resistor is electrically coupled to the transistor in parallel.

In some embodiments, the resistor has a first end portion and a second end portion opposite the first end portion; a first end portion of the resistor is electrically coupled to the drain; and a second end portion of the resistor is electrically coupled to one of: the source and the substrate.

In some embodiments, the resistor contains polysilicon and includes a plurality of winding segments.

In some embodiments, the plurality of winding segments have substantially uniform widths and are substantially evenly spaced apart.

In some embodiments, the dielectric component includes field oxide that protrudes out of the substrate.

In some embodiments, the plurality of doped portions in the drift region includes a P-doped portion disposed between two N-doped portions.

Another one of the broader forms of the present disclosure involves a semiconductor device that includes: a transistor having a gate, a source, and a drain, wherein: the source and the drain are formed in a doped substrate and are separated by a drift region of the substrate; the gate is formed over the drift region and between the source and the drain; and the transistor is configured to handle high voltage conditions that are at least a few hundred volts; a dielectric structure formed between the source and the drain of the transistor, the dielectric structure protruding into and out of the substrate, wherein different parts of the dielectric structure have uneven thicknesses; and a resistor formed over the dielectric structure, the resistor having a plurality of winding segments that are substantially evenly spaced apart.

In some embodiments, the drift region contains both P-doped and N-doped portions.

In some embodiments, the semiconductor device includes a finger-type layout, a line-type layout, a circle-type layout, and a square-type layout.

In some embodiments, the P-doped portion includes a P-body extension that is electrically coupled to the source and protrudes laterally under the dielectric structure; and the N-doped portion includes an n-well that is located between the dielectric structure and the P-body extension.

In some embodiments, the resistor is electrically floating.

In some embodiments, the resistor is electrically coupled to the transistor in parallel.

In some embodiments, the resistor is electrically coupled in parallel to one of: the drain and the source; and the drain and the substrate.

In some embodiments, the winding segments of the resistor have substantially uniform lateral dimensions.

In some embodiments, the resistor contains polysilicon; and the dielectric structure includes field oxide.

One more of the broader forms of the present disclosure involves a method of fabricating a high voltage semiconductor device. The method includes: forming a drift region in a substrate, wherein the drift region includes doped regions with different types of conductivity; forming a dielectric isolation structure over the drift region; forming a gate of a transistor over the dielectric isolation structure; forming a resistor device over the dielectric isolation structure, wherein the resistor device includes a plurality of winding segments; and forming a source and a drain in the substrate, wherein the source and the drain are separated by the drift region and the dielectric isolation structure, and wherein the resistor device and the gate are disposed between the source and the drain.

In some embodiments, the method further includes: forming an interconnect structure over the substrate in a manner such that the resistor device is either electrically coupled in parallel to the transistor or electrically floating.

In some embodiments, the plurality of winding segments of the resistor device have substantially uniform dimensions and spacing.

In some embodiments, the dielectric isolation structure includes a local oxidation of silicon (LOCOS) that protrudes out of a surface of the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate;
   a source and a drain disposed in the substrate;
   a drift region disposed in the substrate and between the source and the drain, wherein the drift region includes a plurality of doped portions having different types of conductivity;
   a dielectric component disposed on a surface of the substrate and between the source and the drain;
   a resistor disposed over the dielectric component, wherein the resistor has a first end portion and a second end portion opposite the first end portion, the first end portion of the resistor being electrically coupled to the drain, and the second end portion of the resistor being electrically coupled to one of: the source and the substrate; and
   a gate disposed over the dielectric component and between the resistor and one of: the source and the drain.

2. The semiconductor device of claim 1, wherein the resistor is electrically floating.

3. The semiconductor device of claim 1, wherein the source, the drain, and the gate are components of a transistor, and wherein the resistor is electrically coupled to the transistor in parallel.

4. The semiconductor device of claim 1, wherein the resistor contains polysilicon and includes a plurality of winding segments.

5. The semiconductor device of claim 4, wherein the plurality of winding segments have substantially uniform widths and are substantially evenly spaced apart.

6. The semiconductor device of claim 1, wherein the dielectric component includes field oxide that protrudes out of the substrate.

7. The semiconductor device of claim 1, wherein the plurality of doped portions in the drift region includes a P-doped portion disposed between two N-doped portions.

8. The semiconductor device of claim 1, wherein the resistor is in physical contact with the dielectric component.

9. A semiconductor device, comprising:
   a transistor having a gate, a source, and a drain, wherein:
      the source and the drain are formed in a doped substrate and are separated by a drift region of the substrate, wherein the drift region contains both P-doped and N-doped portions;
      the gate is formed over the drift region and between the source and the drain; and
      the transistor is configured to handle high voltage conditions that are at least a few hundred volts;
   a dielectric structure formed between the source and the drain of the transistor, the dielectric structure protruding into and out of the substrate, wherein different parts of the dielectric structure have uneven thicknesses; and
   a resistor formed over the dielectric structure, the resistor having a plurality of winding segments that are substantially evenly spaced apart, wherein the resistor is electrically floating.

10. The semiconductor device of claim 9, wherein the semiconductor device includes a finger-type layout, a line-type layout, a circle-type layout, and a square-type layout.

11. The semiconductor device of claim 9, wherein:
the P-doped portion includes a P-body extension that is electrically coupled to the source and protrudes laterally under the dielectric structure; and
the N-doped portion includes an n-well that is located between the dielectric structure and the P-body extension.

12. The semiconductor device of claim 9, wherein the resistor is electrically coupled to the transistor in parallel.

13. The semiconductor device of claim 12, wherein the resistor is electrically coupled in parallel to one of:
the drain and the source; and
the drain and the substrate.

14. The semiconductor device of claim 9, wherein the winding segments of the resistor have substantially uniform lateral dimensions.

15. The semiconductor device of claim 9, wherein:
the resistor contains polysilicon; and
the dielectric structure includes field oxide.

16. A method of fabricating a high voltage semiconductor device, comprising:
forming a drift region in a substrate, wherein the drift region includes doped regions with different types of conductivity;
forming a dielectric isolation structure over the drift region;
forming a gate of a transistor over the dielectric isolation structure;
forming a resistor device over the dielectric isolation structure, wherein the resistor device includes a plurality of winding segments, and wherein the resistor device is in direct contact with the dielectric isolation structure; and
forming a source and a drain in the substrate, wherein the source and the drain are separated by the drift region and the dielectric isolation structure, and wherein the resistor device and the gate are disposed between the source and the drain.

17. The method of claim 16, further comprising: forming an interconnect structure over the substrate in a manner such that the resistor device is either electrically coupled in parallel to the transistor or electrically floating.

18. The method of claim 17, wherein the forming the interconnect structure is performed such that a first end portion of the resistor device is coupled to the drain and a second end portion of the resistor device opposite the first end portion is coupled to one of: the source and the substrate.

19. The method of claim 16, wherein the plurality of winding segments of the resistor device have substantially uniform dimensions and spacing.

20. The method of claim 16, wherein the dielectric isolation structure includes a local oxidation of silicon (LOCOS) that protrudes out of a surface of the substrate.

* * * * *